US012650451B2

(12) United States Patent     (10) Patent No.:   US 12,650,451 B2

Enzinna               (45) Date of Patent:     Jun. 9, 2026

(54) SHIELDING FOR CAPACITANCE SENSING

(71) Applicant: Advanced Energy Industries, Inc., Denver, CO (US)

(72) Inventor: Donald Enzinna, Lockport, NY (US)

(73) Assignee: Advanced Energy Industries, Inc., Denver, CO (US)

( * ) Notice: Subject to any disclaimer, the term of this patent is extended or adjusted under 35 U.S.C. 154(b) by 292 days.

(21) Appl. No.: 18/305,769

(22) Filed: Apr. 24, 2023

(65) Prior Publication Data

US 2024/0353456 A1     Oct. 24, 2024

(51) Int. Cl.
G01R 27/26       (2006.01)
G01R 15/00       (2006.01)

(52) U.S. Cl.
CPC ......... G01R 27/2605 (2013.01); G01R 15/00 (2013.01)

(58) Field of Classification Search
CPC ........ G01R 15/00; G01R 27/02; G01R 27/26; G01R 27/2605; G01D 5/12; G01D 5/14; G01D 5/24
See application file for complete search history.

(56) References Cited

U.S. PATENT DOCUMENTS

| | | | |
|---|---|---|---|
| 3,913,015 A | 10/1975 | Bronaugh et al. | |
| 4,027,203 A | 5/1977 | Moran et al. | |
| 4,876,534 A | 10/1989 | Mead et al. | |
| 5,017,871 A | 5/1991 | Mueller et al. | |

| | | | |
|---|---|---|---|
| 5,075,869 A | 12/1991 | Holler et al. | |
| 5,103,367 A | 4/1992 | Horwitz et al. | |
| 5,436,555 A * | 7/1995 | Locke .................... | G01R 31/60 379/22.03 |
| 5,436,790 A | 7/1995 | Blake et al. | |
| 5,437,040 A | 7/1995 | Campbell et al. | |
| 5,489,888 A * | 2/1996 | Jagiella .................... | G01D 3/08 340/687 |
| 5,539,323 A * | 7/1996 | Davis, Jr. ................. | G01V 9/00 331/65 |
| 5,546,005 A * | 8/1996 | Rauchwerger ........ | G01F 23/266 73/304 C |
| 5,882,492 A | 3/1999 | Manley et al. | |

(Continued)

FOREIGN PATENT DOCUMENTS

| | | |
|---|---|---|
| AU | 2011267897 A1 | 1/2013 |
| EP | 1418668 A1 | 5/2004 |

(Continued)

OTHER PUBLICATIONS

KIPO, Notice of Grounds for Rejection issued in Korean Patent Application No. 10-2022-7001560, Feb. 19, 2025.

(Continued)

*Primary Examiner* — Huy Q Phan
*Assistant Examiner* — David B Frederiksen
(74) *Attorney, Agent, or Firm* — NOD Law PC

(57) ABSTRACT

Systems, methods, and apparatuses for measuring capacitance of a load. The method includes applying, via a conductor, a time-varying voltage signal with a DC offset to the load. At least a portion of the conductor is shielded with a shield and the time-varying voltage signal is applied to the shield. The conductor is coupled to the load and one or more power-related parameters of the conductor are monitored to monitor the capacitance of the load.

17 Claims, 5 Drawing Sheets

(56) References Cited

U.S. PATENT DOCUMENTS

| | | | | |
|---|---|---|---|---|
| 6,095,084 | A | * | 8/2000 | Shamouilian ..... H01J 37/32559 |
| | | | | 156/345.47 |
| 6,430,022 | B2 | | 8/2002 | Leeser |
| 6,486,681 | B1 | * | 11/2002 | Weber .................... G01S 13/04 |
| | | | | 324/688 |
| 6,670,622 | B2 | | 12/2003 | Heike et al. |
| 7,558,045 | B1 | | 7/2009 | Onate et al. |
| 7,656,169 | B2 | * | 2/2010 | Scheckenbach .. B60R 21/01532 |
| | | | | 324/688 |
| 8,108,328 | B2 | | 1/2012 | Hench |
| 8,514,544 | B2 | | 8/2013 | McAnn et al. |
| 8,638,109 | B2 | | 1/2014 | De Boer et al. |
| 9,146,259 | B2 | | 9/2015 | Blake et al. |
| 9,322,850 | B2 | | 4/2016 | Wood et al. |
| 9,496,793 | B2 | | 11/2016 | Bruwer et al. |
| 10,260,388 | B2 | | 4/2019 | Potyrailo et al. |
| 10,837,991 | B2 | | 11/2020 | Sugita et al. |
| 11,280,811 | B2 | | 3/2022 | Enzinna |
| 11,817,340 | B2 | | 11/2023 | Herman |
| 12,019,099 | B2 | | 6/2024 | Enzinna |
| 12,038,464 | B2 | | 7/2024 | Enzinna |
| 12,379,233 | B2 | | 8/2025 | Enzinna |
| 2002/0004186 | A1 | | 1/2002 | Lochschmied |
| 2003/0080755 | A1 | * | 5/2003 | Kobayashi ........... G01D 5/2405 |
| | | | | 324/658 |
| 2003/0160512 | A1 | | 8/2003 | Muldoon |
| 2004/0075442 | A1 | * | 4/2004 | Iannello ............... G01D 5/2417 |
| | | | | 324/632 |
| 2004/0149221 | A1 | | 8/2004 | Koshimizu et al. |
| 2005/0199341 | A1 | | 9/2005 | Delp et al. |
| 2005/0220984 | A1 | | 10/2005 | Sun et al. |
| 2006/0011591 | A1 | | 1/2006 | Sellers |
| 2007/0103092 | A1 | | 5/2007 | Millner et al. |
| 2008/0055813 | A1 | | 3/2008 | Son |
| 2008/0203070 | A1 | | 8/2008 | Ilic et al. |
| 2009/0033353 | A1 | | 2/2009 | Yu et al. |
| 2009/0200281 | A1 | | 8/2009 | Hampton |
| 2009/0267620 | A1 | * | 10/2009 | Takimoto ............... G01N 33/30 |
| | | | | 324/671 |
| 2010/0008016 | A1 | | 1/2010 | Onate et al. |
| 2010/0231229 | A1 | | 9/2010 | Harris et al. |
| 2011/0032654 | A1 | | 2/2011 | McAnn et al. |
| 2013/0003250 | A1 | | 1/2013 | Morimoto et al. |
| 2013/0257048 | A1 | | 10/2013 | Neddermeyer, III et al. |
| 2016/0303983 | A1 | | 10/2016 | Rotay et al. |
| 2016/0377758 | A1 | * | 12/2016 | Dorrough ................. G01V 3/15 |
| | | | | 324/672 |
| 2017/0108540 | A1 | | 4/2017 | Davis et al. |
| 2017/0162415 | A1 | | 6/2017 | Uehara et al. |
| 2017/0330772 | A1 | | 11/2017 | Yamazawa |
| 2017/0334295 | A1 | | 11/2017 | Turner et al. |
| 2017/0338081 | A1 | | 11/2017 | Yamazawa |
| 2017/0355337 | A1 | * | 12/2017 | Lamesch ........... B60R 21/01532 |
| 2017/0358431 | A1 | | 12/2017 | Dorf et al. |
| 2018/0120357 | A1 | | 5/2018 | Takenaka |
| 2019/0066982 | A1 | | 2/2019 | Sato et al. |
| 2019/0170791 | A1 | | 6/2019 | Hetzler et al. |
| 2019/0190242 | A1 | * | 6/2019 | Douglas .................. C23F 11/00 |
| 2020/0211886 | A1 | * | 7/2020 | Kashimura ........... H10P 72/722 |
| 2020/0400719 | A1 | | 12/2020 | Enzinna |
| 2020/0403397 | A1 | | 12/2020 | Nakagawa et al. |
| 2020/0411356 | A1 | | 12/2020 | Fujii et al. |
| 2021/0028713 | A1 | | 1/2021 | Iyer et al. |
| 2021/0237610 | A1 | | 8/2021 | Zheng et al. |
| 2021/0245622 | A1 | | 8/2021 | Wang et al. |
| 2022/0244294 | A1 | | 8/2022 | Enzinna |
| 2022/0283200 | A1 | | 9/2022 | Friedrich et al. |
| 2022/0334160 | A1 | | 10/2022 | Enzinna |
| 2022/0367225 | A1 | | 11/2022 | Herman |
| 2023/0134296 | A1 | | 5/2023 | Benjamin et al. |
| 2023/0141067 | A1 | | 5/2023 | Oliveti |
| 2023/0204643 | A1 | * | 6/2023 | Hatanaka .......... H01J 37/32174 |
| | | | | 324/688 |
| 2023/0231543 | A1 | | 7/2023 | Van Zyl |
| 2023/0298920 | A1 | | 9/2023 | Golovkov et al. |
| 2024/0125832 | A1 | | 4/2024 | Enzinna |
| 2024/0426884 | A1 | | 12/2024 | Enzinna |

FOREIGN PATENT DOCUMENTS

| | | | | |
|---|---|---|---|---|
| JP | H08256027 | A | | 10/1996 |
| KR | 10-2018-0048337 | A | | 5/2018 |
| KR | 10-2019-0040198 | A | | 4/2019 |
| WO | WO-2013001098 | A2 | * | 1/2013 ............... G01B 7/14 |
| WO | 2015120419 | A1 | | 8/2015 |
| WO | 2019044258 | A1 | | 3/2019 |
| WO | 2020205339 | A1 | | 10/2020 |

OTHER PUBLICATIONS

PCT, International Search Report and Written Opinion issued in PCT/US2024/058374, Jan. 24, 2025, 20 pages.

Astacio-Oquendo, Giovanni, "Office Action Regarding U.S. Appl. No. 16/901,746", May 27, 2021, p. 36, Published in: US.

Astacio-Oquendo, Giovanni, Non-Final Office Action issued in U.S. Appl. No. 17/676,885, filed Nov. 9, 2023, 38 pages.

CNIPA, Notification of the First Office Action issued in CN Application No. 202080051937.5, Oct. 30, 2024, 21 pages.

EPO, Extended European Search Report issued in EP Application No. 20825717.0, Jun. 16, 2023, 14 pages.

KIPO, "International Search Report and Written Opinion Re International Application No. PCT/US2022/020507", Jul. 14, 2022, p. 9, Published in: WO.

National Instruments—NI (ni.com): "Floating Signal Sources" via link https://Avww.ni.com/docs/en-US/bundle/usb-6008-6009-feature/page/float-sig-sourc20esi.gnahl% i2m0solur#ce:%20~is: otptiecaxl%t20=isAol%ato2rs0%2fC%l20oanda%2t0iisonlatgio%n %20amplifiers (Year: 2015).

Nguyen, Hoai an D, Final office action issued in U.S. Appl. No. 17/694,731, filed Oct. 25, 2023, 46 pages.

Nguyen, Hoai an D, Office action issued in U.S. Appl. No. 17/694,731, filed Jun. 8, 2023, 35 pages.

PCT, "International Search Report and Written Opinion Regarding International Application No. PCT/US2020/037838", Aug. 14, 2020, p. 13, Published in: AU.

PCT, "International Search Report and Written Opinion Regarding International Application No. PCT/US2022/020536", Jul. 14, 2022, p. 9, Published in: KR.

PCT, International Preliminary Report on Patentability issued in PCT/2020/037838, Dec. 30, 2021, 9 pages.

PCT, International Preliminary Report on Patentability issued in PCT/2022/020507, Sep. 28, 2023, 6 pages.

PCT, International Preliminary Report on Patentability issued in PCT/US2022/020536, Nov. 9, 2023, 6 pages.

Trek, Inc., "The Electrostatic Semiconductor Wafer Clamping/Chucking System (ESC)", Trek Application Note No. 6002 , 2013, pp. 1-8.

CNIPA, Notification of the second office action issued in CN Application No. 202080051937.5, May 14, 2025, 11 pages.

PCT, International Search Report and Written Opinion issued in PCT/US2025/015206, Apr. 10, 2025, 17 pages.

Final Office Action received for U.S. Appl. No. 17/694,731, mailed on Oct. 25, 2023, 15 pages.

Non-Final Office Action received for U.S. Appl. No. 18/678,637, mailed on Jan. 12, 2026 10 pages.

Office Action received for Great Britain Patent Application No. 2512737.4, mailed on Feb. 2, 2026, 8 pages.

Office Action received for Korean Patent Application No. 10-2023-7035392, mailed on Nov. 7, 2025, 12 pages (6 pages of English Translation and 6 pages of Original Document).

* cited by examiner

Apply a time varying signal with a DC offset to a conductor
204

Shield the conductor
206

Apply the time varying signal to the shield
208

Couple the conductor to an unknown capacitance
210

Monitor one or more power-related parameters of the conductor to monitor the unknown capacitance
212

SHIELDING FOR CAPACITANCE SENSING

BACKGROUND

Field

The present invention relates generally to monitoring electrical elements, and more particularly, to monitoring capacitance.

Background

Monitoring capacitance is important in many contexts. Among other contexts, monitoring capacitance is important when electrostatically holding a work piece to a chuck. Electrostatic chucks are used to support workpieces (e.g., wafers) in a variety of processing systems. In a deposition system, for example, an electrostatic chuck may be used to clamp a wafer in place while a thin film is deposited on the wafer. In an etch system, as another example, an electrostatic chuck may be used to clamp a wafer in place while material is being chemically etched from the wafer.

Electrostatic chucks use electrostatic force to hold the workpiece in place. An electrostatic chuck has electrodes that are energized with a clamping voltage, which electrostatically clamps the workpiece to the surface of the electrostatic chuck. The electrodes in the electrostatic chuck are coupled to an electrostatic power supply and a controller. The electrostatic power supply receives the control signal from the controller and generates a clamping voltage adapted to clamp the substrate with a clamping force.

Proper positioning of the workpiece relative to the electrostatic chuck is important at various times before, during, and after typical workpiece processes. For example, it is important to ensure that a workpiece is properly loaded onto the electrostatic chuck before applying the clamping voltage. As another example, it may be desirable to determine whether the workpiece is clamped or unclamped at certain times.

The electrostatic power supply may include a direct current (DC) voltage generator configured to generate a DC clamping voltage for the clamping electrode assembly of the electrostatic chuck and an alternating current (AC) voltage generator configured to generate an AC signal. The position of the workpiece may be detected by monitoring a capacitance of a combination of the workpiece and the electrostatic chuck. For example, when the workpiece is properly positioned on the electrostatic chuck, the sensed capacitance may be higher than when the workpiece is not properly positioned.

The varying level of current provided to the electrostatic chuck (in response to the application of the AC voltage) enables the capacitance of the electrostatic chuck to be monitored, and as a consequence, the position of the workpiece may be monitored by monitoring the current provided to the electrostatic chuck.

Electrostatic power supplies are known to measure capacitance in a range of 0-50 nF and the typical capacitance of a wafer, while in place on a chuck, is in the range of 3-5 nF with an extra 1 nF when the wafer is clamped. Cables may add about 0.1 nF per meter, so the presence of 1-5 nF background capacitance is not uncommon. This background capacitance needs to be accommodated with a bigger range, which reduces resolution.

SUMMARY

Some aspects of the present disclosure may be characterized as a method for determining capacitance of a load where the method includes applying, via a conductor, a time-varying voltage signal with a DC offset to the load and shielding at least a portion of the conductor with a shield. In addition, the time-varying voltage signal is applied to the shield and the conductor is coupled to the load. One or more power-related parameters of the conductor are monitored to monitor the capacitance of the load.

Other aspects of the present disclosure may be characterized as an apparatus for sensing capacitance of a load where the apparatus includes an output node to couple to a conductor and a shield node to couple to a shield for the conductor. Power circuitry is configured to apply a time varying signal to the shield node and apply, to the output node, the time varying signal with a DC offset. A capacitance monitor senses the capacitance of the load by monitoring one or more power-related parameters of the conductor.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or." As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various elements, these elements should not be limited by these terms. These terms are only used to distinguish one element from another element.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

Figure 1:
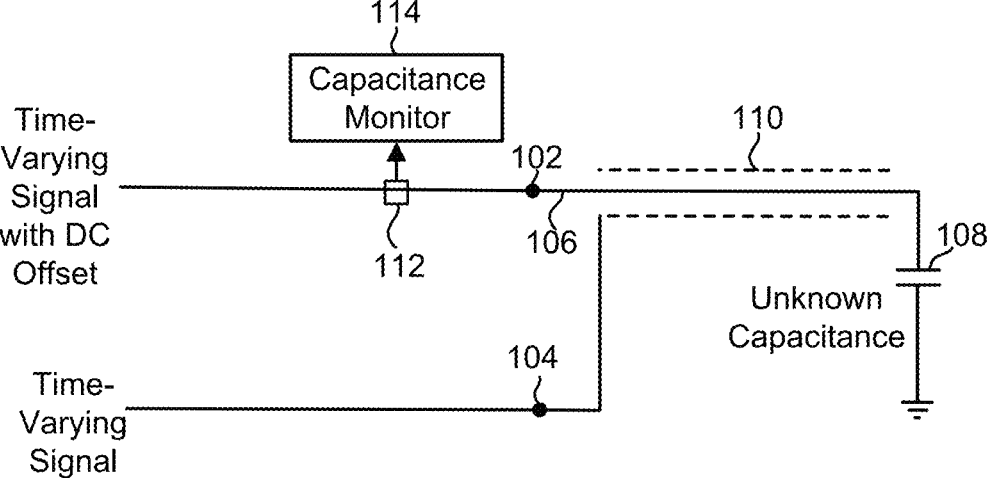
FIG. 1 illustrates an example of a capacitance sensing system.
Figure 2:
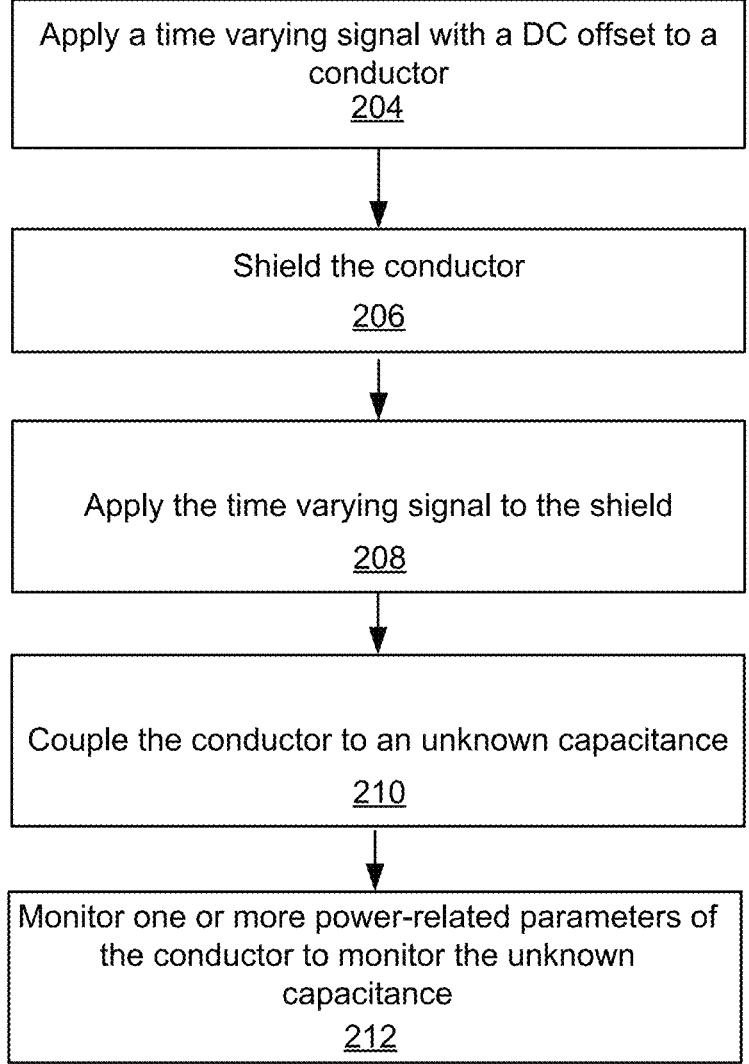
FIG. 2 illustrates a method that may be traversed in connection with the capacitance sensing system of FIG. 1.

Referring first to FIG. 1, shown is an example capacitance monitoring system. While referring to FIG. 1, simultaneous reference to made to FIG. 2, which depicts a method for monitoring capacitance that may be carried out in connection with the capacitance monitoring system of FIG. 1. As depicted, a time-varying signal with a DC offset is applied (e.g., at an output node 102) to a conductor 106 (Block 204) and the conductor 106 is shielded with a shield 110 (Block 206), e.g., by placing the shield 110 in close proximity to the conductor 106. In addition, the time-varying signal is also applied (e.g., at a shield node 104) to the shield 110 (Block 208). The conductor 106 is coupled to an unknown capacitance 108 (Block 210) and one or more power related parameters of the conductor 106 are monitored (e.g., with a capacitance monitor 114) to monitor the unknown capacitance (Block 212).

The DC offset may be a DC voltage selected based upon the particular load associated with the unknown capacitance 108. As described further herein, the load associated with the unknown capacitance 108 may be an electrostatic chuck, and in that use case, the DC voltage be, for example and without limitation, from 800 volts to 5000 volts. The time-varying signal applied to the shield 110 may be substantially equal in amplitude, frequency, and phase to the time-varying signal applied to the conductor 106. As an example, without limitation, the time-varying signal may be a sinusoidal voltage with a voltage that may be between negative 5 volts and positive 5 volts and the frequency may be between 1 kHz and 2 kHz. Because the time-varying signal on the shield 110 is the same as the time-varying signal on the conductor 106, dV/dt=0 and cable capacitance is effectively neutralized. The shield 110 does not need to be at the same DC potential as the conductor 106 because dV/dt=0 for DC voltages.

As is known to those of ordinary skill in the art, the capacitance monitor 114 may include a current monitor to measure current (e.g., sensed with a current sensor 112) in a conduction path that includes the conductor 106. The capacitance monitor 114 may determine the capacitance of the unknown capacitance 108 based upon the measured current. The current sensor 112 may be realized, for example and without limitation, by a flux gate sensor, a hall effect sensor, resistive shunt sensor, or a current mirror circuit.

Figure 3:
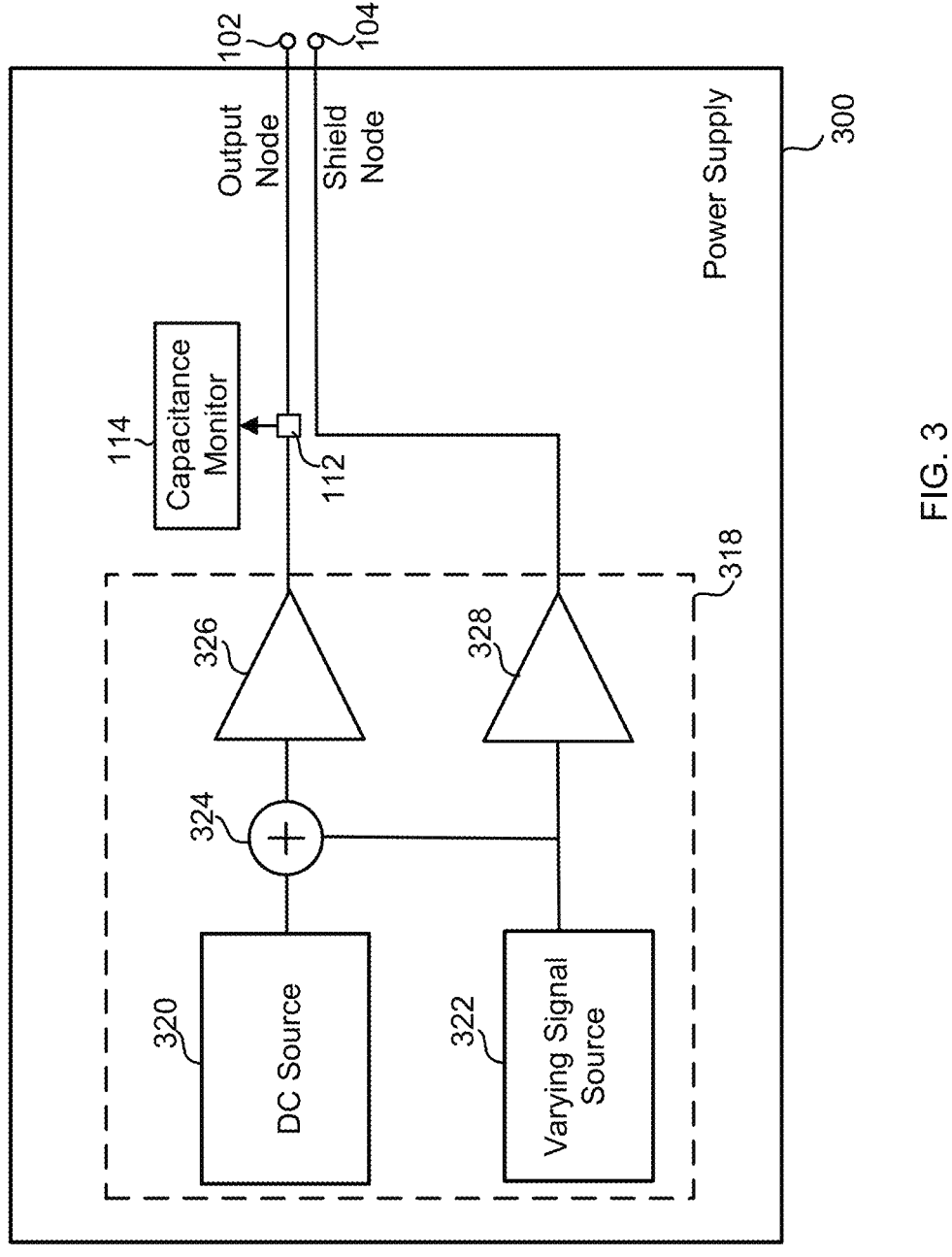
FIG. 3 is a block diagram depicting an example power supply that may be implemented to realize the capacitance sensing system of FIG. 1.

Referring next to FIG. 3, shown is a block diagram depicting a power supply 300 that may be used in the capacitance sensing system depicted in FIG. 1. As shown, power circuitry 318 comprising both a DC source 320 and the varying signal source 322 are coupled to a signal injector 324, and the signal injector 324 is coupled to an input of a first amplifier 326, and an output of the first amplifier 326 is coupled to the output node 102. As shown, the varying signal source 322 is coupled to an input of a second amplifier 328, and the output of the second amplifier 328 is coupled to the shield node 104. The output node 102 is configured to couple to the conductor 106 and the shield node 104 is configured to couple to the shield 110 for the conductor 106. In general, the power circuitry 318 is configured to apply a time varying signal to the shield node 104 and apply, to the output node 102, the time-varying signal with a DC offset. The capacitance monitor 114 is configured to sense the unknown capacitance 108 of a load by monitoring one or more power-related parameters of the conductor 106.

In this embodiment, the DC source 320 is configured to provide a DC source signal and the varying signal source 322 is configured to provide a low voltage version of the time-varying voltage signal. The signal injector 324 is configured to inject the low-voltage version of the time-varying voltage signal onto the DC source voltage to produce a low voltage version of the time-varying voltage signal with the DC offset. The first amplifier 326 is configured to amplify the low voltage version of the time-varying voltage signal with the DC offset to produce the time-varying voltage signal with the DC offset, and the second amplifier 328 is configured to amplify the low-voltage version of the time-varying voltage signal to produce the time-varying voltage signal.

The DC source 320 may be realized, for example and without limitation, by a digital to analog converter that provides the DC source signal as a voltage (e.g., from 0 to 10V) responsive to a digital input. The signal injector 324 may comprise a summing amplifier to inject the low-voltage version of the time-varying voltage signal onto the DC source voltage to produce the low voltage version of the time-varying voltage signal with the DC offset. The first amplifier 326 may amplify the low voltage version of the time-varying voltage signal with the DC offset with, for example and without limitation, a gain of 100 to produce the time-varying voltage signal with the DC offset. A gain of the second amplifier 328 may be set so that the same time-varying signal (same amplitude and phase) is applied to the shield 110 as is applied to conductor 106. The first amplifier 326 and the second amplifier 328 may be realized by any of a variety of amplifiers including class A, class B, class A/B, class D, and class E amplifiers as those of ordinary skill in the art will recognize.

In some implementations, the current measuring or capacitance monitoring aspects of the capacitance monitor 114 may comprise an analog-to-digital converter used to convert an analog representation of measured current (measured by the current sensor 112) into a digital signal representation of the measured current. The capacitance monitor 114 may process the digital signal representation of the measured current, such as through filtering and synchronous detection, to determine the unknown capacitance 108. In a similar manner, voltage signals of the present disclosure may be converted into a digital signal representation and processed by the capacitance monitor 114 to aid in determining capacitance.

Figure 4:
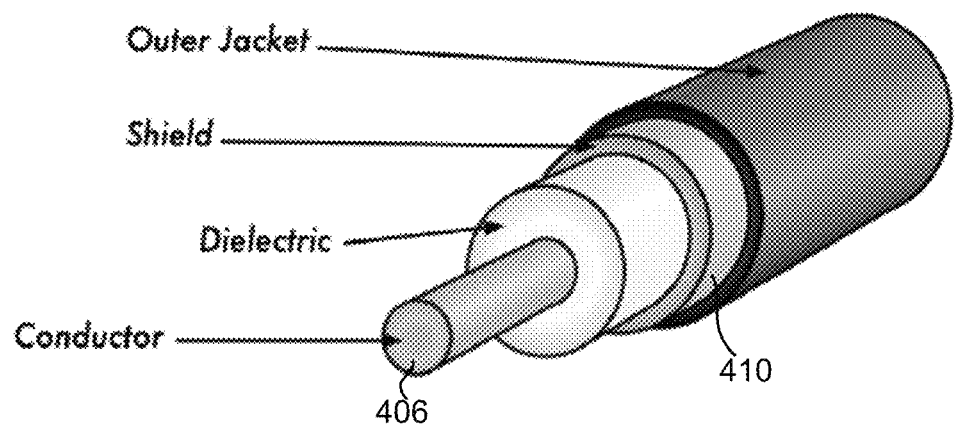
FIG. 4 illustrates an example of a shield and conductor that may be used in connection with embodiments disclosed herein.

Referring next to FIG. 4, shown is an example an inner conductor 406 and a shield conductor 410 that may be implemented in a coaxial cable to realize the conductor 106 and shield 110, respectively. When implemented in this configuration, the shield conductor 410 co-axially shields the inner conductor 406 and the output node 102 is coaxially arranged with the shield node 104. In some implementations, the shield conductor 410 is a wrapped foil shield so that the shielding at Block 206 includes shielding the conductor with a wrapped foil shield. It is also contemplated that at least a portion of the conductor 106 comprises a trace on a printed circuit board so that shielding the conductor 106 at Block 206 comprises shielding the trace with conductive layers above and below the trace. Those of ordinary skill in the art, in view of this disclosure, are very familiar with printed circuit boards, traces thereon, and layers that may be positioned above and below the trace.

Figure 5:
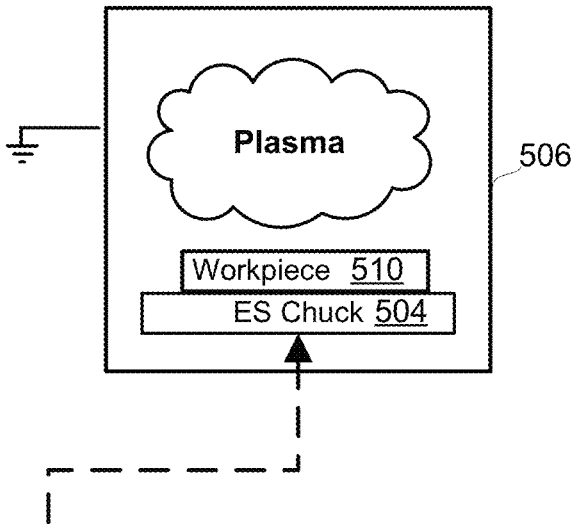
FIG. 5 depicts an example of a capacitive load.

Referring next to FIG. 5, shown is an example load that may have the unknown capacitance 108. As shown, the load includes a combination of an electrostatic chuck 504 and a workpiece 510, and the combined capacitance of the electrostatic chuck 504 and the workpiece 510 depends upon how firmly the workpiece 510 is clamped to an electrostatic chuck 504 of a plasma processing chamber 506. The plasma processing chamber 506 may be realized by any of a variety of chambers (e.g., comprising a vacuum enclosure which is evacuated by a pump or pumps (not shown)).

The DC voltage applied by the power supply 300 may effectuate a DC clamping voltage at the electrostatic chuck 504 that draws the workpiece 510 to the electrostatic chuck 504 while the time varying signal may be utilized to monitor a position of the workpiece 510 relative to the electrostatic chuck 504).

To detect a position of the workpiece 510 in the context of the electrostatic chucking system, the relationship between capacitance and positions of workpiece may be empirically determined, and threshold capacitances may be established that are indicative of, for example, the workpiece 510 "in place" or the workpiece 510 "in clamp." The threshold capacitance values may be stored in nonvolatile memory in connection with workpiece position data to enable a mapping between capacitance values and workpiece position. The workpiece position may be determined using the empirically obtained data in connection with the current measurements to obtain a capacitance seen at the electrostatic chuck 504. As those of ordinary skill in the art readily appreciate, the capacitance of a load may be determined based upon the time-varying (e.g., AC) voltage and current based upon the following relationship:

$$I(t) = C\frac{dV}{dt}.$$

Once the capacitance of the load (e.g., the combination of the electrostatic chuck 504 and the workpiece 510) is obtained, the position of the workpiece 510 may be obtained by reference to the stored data in nonvolatile memory.

Figure 6:
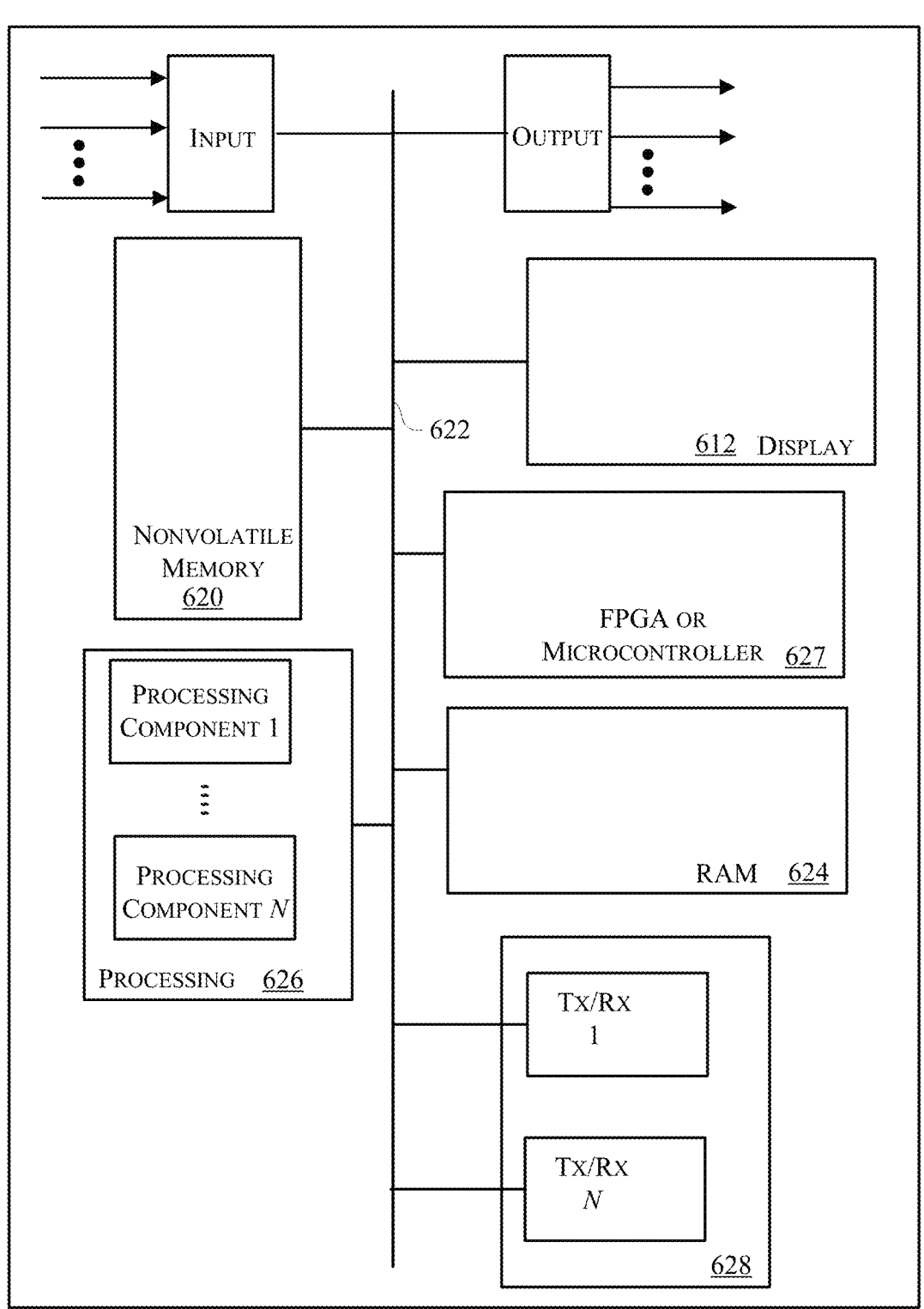
FIG. 6 is a block diagram depicting processing-related components that may be used to realize aspects described herein.

As described above, the functions and methods described in connection with the embodiments disclosed herein may be effectuated utilizing hardware, in processor executable instructions encoded in non-transitory machine readable medium, or as a combination of the two. Referring to FIG. 6 for example, shown is a block diagram depicting physical components that may be utilized to realize one or more aspects of the capacitance sensing technologies disclosed herein. Moreover, multiple instances of the computing device depicted in FIG. 6 may be implemented in the systems described herein. As shown, in this embodiment a display 612 and nonvolatile memory 620 are coupled to a bus 622 that is also coupled to random access memory ("RAM") 624, a processing portion (which includes N processing components) 626, a field programmable gate array (FPGA) 627, and a transceiver component 628 that includes N transceivers. Although the components depicted in FIG. 6 represent physical components, FIG. 6 is not intended to be a detailed hardware diagram; thus, many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

The display 612 generally operates to provide a user interface for a user, and in several implementations, the display 612 is realized by a touchscreen display. For example, display 612 can be implemented as a part of the capacitance module 114 to enable a user to change settings of the systems disclosed herein and/or receive operational feedback about the workpiece (e.g., wafer) position information and capacitance information. The display may also function to enable an operator to adjust the DC source 320 and/or the variable signal source 322.

In general, the nonvolatile memory 620 is non-transitory memory that functions to store (e.g., persistently store) data and machine readable (e.g., processor executable) code (comprising executable code that is associated with effectuating the methods described herein). In some embodiments, for example, the nonvolatile memory 620 includes bootloader code, operating system code, file system code, and non-transitory processor-executable code to facilitate the execution of the methods described herein. The nonvolatile memory 620 may also be used to store empirically obtained data that relates workpiece position to capacitance data. The nonvolatile memory 620 may also include processor executable instructions to implement the capacitance monitor 114 and current monitoring aspects of the capacitance monitor 114.

In many implementations, the nonvolatile memory 620 is realized by flash memory (e.g., NAND or ONENAND memory), but it is contemplated that other memory types may also be utilized. Although it may be possible to execute the code from the nonvolatile memory 620, the executable code in the nonvolatile memory is typically loaded into RAM 624 and executed by one or more of the N processing components in the processing portion 626.

In operation, the N processing components in connection with RAM 624 may generally operate to execute the instructions stored in nonvolatile memory 620 to realize the functionality of one or more components and modules disclosed herein. As one of ordinary skill in the art will appreciate, the processing portion 626 may include a video processor, digital signal processor (DSP), graphics processing unit (GPU), and other processing components. In digital implementations, a DSP may be used to effectuate aspects of the time-varying signal injection.

In addition, or in the alternative, the field programmable gate array (FPGA) 627 may be configured to effectuate one or more aspects of the functions and methodologies described herein. For example, non-transitory FPGA-configuration-instructions may be persistently stored in nonvolatile memory 620 and accessed by the FPGA 627 (e.g., during boot up) to configure the FPGA 627 to effectuate the functions described herein.

The input component may operate to receive signals (e.g., from current sensor 112) that are indicative of the monitored time-varying current provided at the output node 102. The input component may also receive a voltage signal indicative of the voltage of the output node 102. And the output component generally operates to provide one or more analog or digital signals to effectuate an operational aspect of components described herein. For example, the output portion may function as the DC source to provide the DC source signal to the first amplifier 326.

The depicted transceiver component 628 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for determining capacitance of a load, the method comprising:

producing a time-varying voltage signal by amplifying a low-voltage version of the time-varying voltage signal;

producing a DC source voltage;

injecting the low-voltage version of the time-varying voltage signal onto the DC source voltage to produce a low voltage version of the time-varying voltage signal with a DC offset;

amplifying the low voltage version of the time-varying voltage signal with the DC offset to produce a time-varying voltage signal with the DC offset;

applying, via a conductor, the time-varying voltage signal with the DC offset to the load;

shielding at least a portion of the conductor with a shield;

applying the time-varying voltage signal to the shield;

coupling the conductor to the load; and monitoring one or more power-related parameters of the conductor to monitor the capacitance of the load.

2. The method of claim 1, wherein shielding the conductor comprises co-axially shielding the conductor.

3. The method of claim 2, wherein shielding the conductor includes shielding the conductor with a wrapped foil shield.

4. The method of claim 1, wherein at least a portion of the conductor comprises a trace on a printed circuit board, and wherein shielding the conductor comprises shielding the trace with conductive layers above and below the trace.

5. The method of claim 1, wherein monitoring comprises measuring current in the conductor and calculating the capacitance based upon the measured current.

6. The method of claim 1, wherein the injecting comprises injecting the low-voltage version of the time-varying voltage signal onto the DC source voltage with a summing amplifier.

7. The method of claim 1, wherein amplifying the low voltage version of the time-varying voltage signal with the DC offset comprises amplifying the low voltage version of the time-varying voltage signal with a gain to produce the time-varying voltage signal with the DC offset.

8

8. The method of claim 1, comprising:

coupling the conductor to an electrostatic chuck; and monitoring one or more power-related parameters of the conductor to monitor a combined capacitance of the electrostatic chuck and a workpiece positioned on the electrostatic chuck.

9. The method of claim 8, comprising:

shielding at least a portion of the electrostatic chuck to nullify stray capacitances in the electrostatic chuck.

10. An apparatus for sensing capacitance of a load, the apparatus comprising:

a DC source to provide a DC source voltage;

a varying signal source to provide a low-voltage version of a time-varying voltage signal;

a signal injector configured to inject the low-voltage version of the time-varying voltage signal onto the DC source voltage to produce a low voltage version of the time-varying voltage signal with a DC offset;

a first amplifier to amplify the low voltage version of the time-varying voltage signal with the DC offset to produce a time-varying voltage signal with the DC offset; and a second amplifier to amplify the low-voltage version of the time-varying voltage signal to produce the time-varying voltage signal;

an output node to couple to a conductor;

a shield node to couple to a shield for the conductor;

power circuitry configured to:

apply the time-varying voltage signal to the shield node; and apply, to the output node, the time-varying signal with the DC offset; and a capacitance monitor to sense the capacitance of the load by monitoring one or more power-related parameters of the conductor.

11. The apparatus of claim 10, wherein the output node is coaxially arranged with the shield node.

12. The apparatus of claim 11, comprising a coaxial cable, the coaxial cable comprising an inner conductor configured to couple to the output node and a shield conductor configured to couple to the shield node.

13. The apparatus of claim 12, wherein the shield conductor comprises a wrapped foil.

14. The apparatus of claim 12, wherein the capacitance monitor comprises a current monitor to monitor current and determine the capacitance of the load based upon the monitored current.

15. The apparatus of claim 14, wherein the current monitor includes one or more of a flux gate sensor, a resistive shunt sensor, a hall effect sensor, and a current mirror circuit.

16. The apparatus of claim 10, comprising a printed circuit board, the printed circuit board comprising:

a trace coupled to the conductor; and conductive layers above and below the trace.

17. The apparatus of claim 10, wherein the signal injector comprises a summing amplifier.

* * * * *